US006657488B1

(12) United States Patent
King et al.

(10) Patent No.: US 6,657,488 B1
(45) Date of Patent: Dec. 2, 2003

(54) OFFSET CORRECTION AND SLICING LEVEL ADJUSTMENT FOR AMPLIFIER CIRCUITS

(75) Inventors: Eric T. King, Temple, NH (US); Michael H. Perrott, Cambridge, MA (US); Douglas F. Pastorello, Hudson, NH (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/036,986

(22) Filed: Dec. 31, 2001

Related U.S. Application Data

(60) Provisional application No. 60/302,935, filed on Jul. 3, 2001.

(51) Int. Cl.[7] ............................ H03F 1/02; H03F 21/00; H03L 5/00
(52) U.S. Cl. ............................ 330/9; 330/11; 327/307
(58) Field of Search .................... 330/9, 11; 327/307

(56) References Cited

U.S. PATENT DOCUMENTS

| 5,381,398 A | * | 1/1995 | Kaneko et al. | 369/124.11 |
| 5,559,772 A | * | 9/1996 | Takeda | 369/44.36 |
| 5,559,841 A | | 9/1996 | Pandula | |
| 6,151,152 A | | 11/2000 | Neary | |
| 6,208,211 B1 | | 3/2001 | Zipper et al. | |
| 6,333,902 B1 | * | 12/2001 | Shim | 369/47.54 |
| 6,437,723 B1 | * | 8/2002 | Otsuka et al. | 341/155 |

OTHER PUBLICATIONS

Giga, "2.5 Gbit/s Clock and Data Recovery GD16522", Data Sheet Rev. 20, Giga, Sep. 25, 2000, pp. 1–11.
Maxim, "2.5Gbps, Low–Power, +3.3V Clock Recovery and Data Retiming IC", Maxim Integrated Products, 1998, pp. 1–8.

* cited by examiner

*Primary Examiner*—Patricia Nguyen
(74) *Attorney, Agent, or Firm*—Zagorin, O'Brien & Graham, LLP

(57) ABSTRACT

A slice and offset circuit is provided that uses a digital integrator in the feedback loop of the offset cancellation circuitry. A slice circuit receives an indication of a desired slice voltage and supplies a signal to specify the slice level, which is combined with a sensed offset level of the amplifier. The feedback loop includes a low pass filter that receives the combined signal indicative of the offset and the slice level. The low pass filter includes the digital integrator circuit that includes an up/down counter that counts in a direction determined according to a digital signal having a ones-density indicative of a value of the combined signal with respect to a reference signal, thereby generating a feedback signal that cancels offset and adjusts for slice.

49 Claims, 10 Drawing Sheets

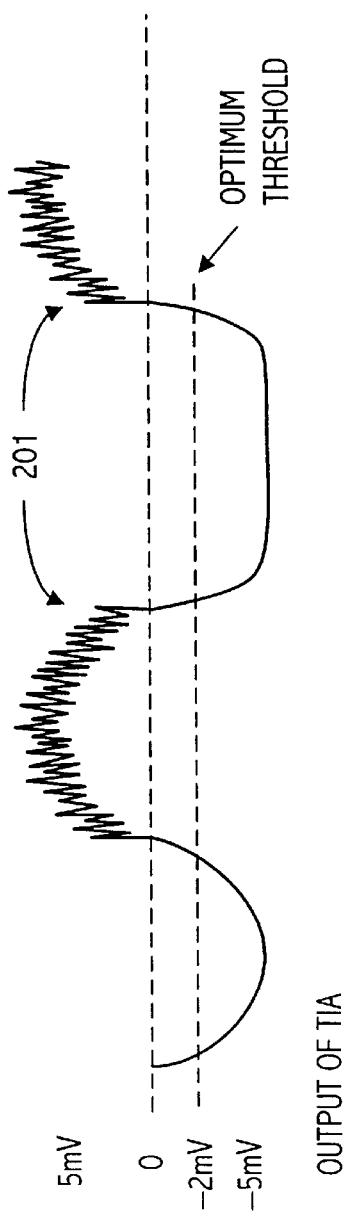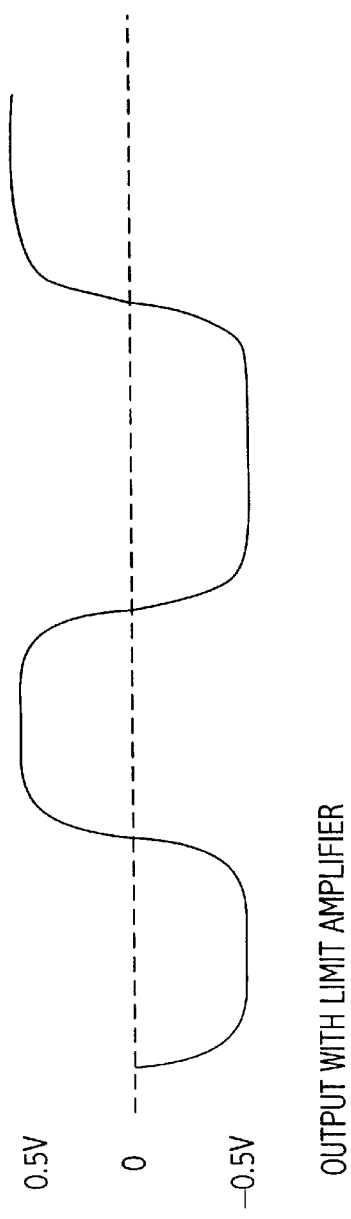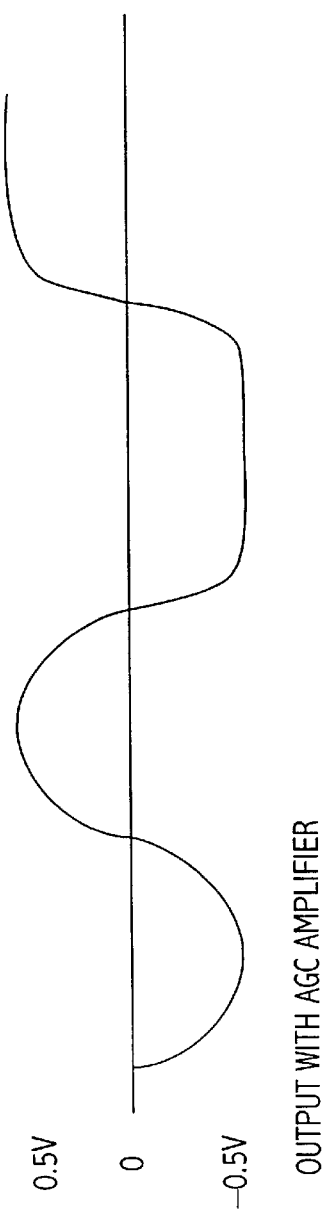

OFFSET CORRECTION AND SLICING LEVEL ADJUSTMENT FOR AMPLIFIER CIRCUITS

CROSS-REFERENCE TO RELATED APPLICATION

This application claims the benefit under 35 U.S.C. §119 (e) of U.S. Provisional Application No. 60/302,935, filed Jul. 3, 2001, which application is incorporated herein by reference in its entirety.

BACKGROUND OF THE INVENTION

1. Field of the Invention

This invention relates to amplifier circuits and more particular to offsets associated with amplifiers.

2. Description of the Related Art

FIG. 1 shows the block diagram of a typical high-speed optical receiver 100, designed to work at rates of, e.g., 2.7 GHz. The received optical energy 101 is converted to a current using a photodiode, 103. The photodiode signal current $I_o$ is converted to a voltage using the transimpedance amplifier (TIA) 105. The signal at the output of TIA 105 is small for low optical energy signals, and can contain significant corruption due to, e.g., noise and limited rise and fall times. The typical range of signal amplitude at the output of the TIA 105 is from a few millivolts to a few hundred millivolts. TIA 105 is followed by additional gain, usually implemented with a limit amplifier or an automatic gain control (AGC) amplifier 107. Note that although FIG. 1 shows a fully differential system, it is common for some of the illustrated signals, e.g., Io, V1, V2 or the clock and data outputs, to be single ended, and the principles described herein are still applicable.

The function of the limit amplifier is to produce a consistent waveform from the TIA output, which can be used by a clock and data recovery circuit (CDR) 109, irrespective of the incoming optical energy. The clock and data recovery circuit 109 recovers both the data and the clock typically embedded in the input data stream received by the photodiode D1 and provides differential clock and data signals 111 and 113, respectively.

If amplifier 107 is implemented as a limit amplifier, adequate gain is provided to create a full swing output from the minimum desired input signal. For larger input signals, the output does not increase significantly, however the output signal will be improved in regards to deterministic jitter and noise performance. If amplifier 107 is implemented as an AGC amplifier, the output signal strength is detected, and the gain is adjusted to provide optimal signal strength at the output for a wide range of input signal levels. In the case of a small input signal, the AGC gain will be large, comparable to the gain of a limit amplifier receiving a small signal in the same application. For larger signals, the AGC circuitry will reduce the gain to maintain the desired output signal strength, keeping the amplifier out of saturation. A larger signal will produce a better signal at the output of the AGC, since circuit non-idealities such as input-referred offset and noise become less significant.

FIGS. 2A shows exemplary output from the TIA amplifier 105. FIGS. 2B and 2C show respectively the expected outputs for a limit amplifier and an AGC amplifier for the input signal shown in 2A. FIG. 2B a shows that the limit amplifier is driven to the maximum output swing (+/–0.5V). Though it preserves the data values and zero crossings, it does not preserve the shape of the input signals due to the non-linear limiting function. FIG. 2C shows that the AGC amplifier gain is set at a level to produce an output that is more linearly related to the input.

An AGC amplifier is implemented by detecting the signal strength at some point in the amplifier. This signal is used in a negative feedback loop to control the gain of the amplifier so that an optimal output signal is produced. Implementation of a high-speed AGC amplifier in a CMOS process presents many challenges. One reason for this is that a high quality diode is not readily available in a standard CMOS process. The diode facilitates rectification of the signal for amplitude detection. Though a similar function can be implemented using MOS devices, the circuit non-idealities and limited bandwidth of the devices make amplitude detection difficult. In a high speed bipolar process, accurate signal detection is feasible to provide the feedback signal for the AGC amplifier. Because the recovery of a bipolar device from an overdrive (saturation) can be slow, an AGC amplifier is more desirable for a bipolar process.

The limit amplifier or AGC amplifier often has two other functions associated with it: offset correction and slice level adjustment. An undesired offset in the amplifier can prevent the proper detection of small signals and random amplifier offsets, due to mismatch between critical devices, become greater with smaller device sizes. For a gigahertz CMOS limiting amplifier optimized for maximum gain and bandwidth, device sizes are relatively small and offsets on the order of the amplifier sensitivity (the minimum input peak to peak voltage) are not uncommon. That makes it necessary to include circuitry that senses the amplifier offset and cancels it. The offset correction is often implemented with the use of negative feedback from the amplifier's output.

In some communication systems, such as those that operate in accordance with the Synchronous Optical Network (SONET) standard, scrambling and other techniques ensure that over the long term there will be a nearly equal amount of ones and zeros received by the data processing system. In such a system, desired offset correction can be implemented conceptually with the feedback system illustrated in FIG. 3. The offset is represented by the voltage $V_{off}$, which is shown as entering summing node 303. A sense circuit 301 detects any deviation from this equality, i.e., the amplifier offset. A trim circuit 305, which is coupled to summing node 307, can utilize the output of the sense circuit 301 to trim the offset.

Since the data equality holds only over a long period of time, the sensing circuitry should have a very low bandwidth. If not, the offset correction signal that is fed back can become a jitter mechanism. Many existing offset correction systems employ a purely analog approach, which makes realization of this low bandwidth only possible with large external passive devices. That results in extra pins on the integrated circuit being devoted to connecting these passive devices. However, the available number of pins can be limited on integrated circuits such as those implementing clock and data recovery circuits, and extra pins can result in bigger packages and thus bigger component costs. Not only do passive devices cost both board area and adversely affect component cost, their use brings a very sensitive node out of the chip, where great care should be taken to shield it from unwanted noise sources.

Another function that may be implemented by the amplifier stage 107 (see FIG. 1) is to provide an adjustable slicing level to compensate for the asymmetric noise characteristic present in the photodiode output. Slicing level is defined as the threshold voltage where an incoming signal is determined to be either a "1" bit or a "0" bit. The need for an adjustable slicing level can be seen by looking at the photodiode output current or the TIA output voltage shown in FIG. 2A. At low levels of optical energy (corresponding to a zero level bit for example), the noise current is low. At higher levels of optical energy (corresponding to a one-level bit), the noise current may be higher. This asymmetry, as shown in FIG. 2A, may require an introduction of an intentional offset to create the most reliable output. As shown in FIG. 2A, a slicing level of zero gives a smaller amount of margin for the positive swing compared to the negative swing. If the threshold is set to roughly −2 mV in the case shown, the margin is more symmetric and better results are to be expected. Thus, introducing a small offset serves to optimize noise margin and signal strength. FIG. 4 illustrates the concept of introducing a slice voltage at summing node 401.

Some systems employ a closed-loop approach to dynamically adjust the slicing voltage. Some metric for system performance is monitored and the slicing voltage is adjusted accordingly. In this case, the amplifier offset is unimportant. Other systems may require that the slicing voltage remain at a fixed, repeatable level. Some solutions of this type of system provide the system designer with the means to monitor the output of the amplifier, allowing some feedback system to be designed off-chip which trims the slicing voltage to a desired level regardless of the amplifier offset. As in the offset correction example above, this requires large external components and exposes sensitive nodes to noise.

FIG. 5 shows a block diagram representation of a typical offset correction applied to either a limit amplifier or AGC amplifier in an optical system. For such a system it is assumed that the input signal has a zero average, and in the absence of amplifier offset, the output signal should have a zero average. In this configuration, the low pass filter H(s) 501 is used to find the output average value, and creates a negative feedback signal which is used to remove the output referred offset. One disadvantage of this arrangement is that if a non-zero threshold is set in the amplifier to implement an adjustable slicing function, the result of the offset correction loop will be to cancel out the slicing function. Capacitors 501 and 503 5 AC couple the input to the amplifier so that any DC conditions at the output of TIA 105 do not affect the amplifier. In this arrangement, if the TIA produces balanced differential output signals, the offset loop will only act on the amplifier offset. For unbalanced drive, or a DC coupled configuration, the offset loop will remove the combined offset of the incoming signal offset and the amplifier offset (if enough correction range is available).

In the case of an AGC amplifier, adjusting slice at the amplifier output can be acceptable, as there is a linear relationship between the input signal size and the output signal size, which can be roughly determined from parameters in the AGC control circuitry. But in the case of a limit amplifier, where the amplifier output is saturated for even the minimum desired input signal, a correction at the output cannot easily be related to the input signal size. Also, due to the large gain of the limit amplifier, adjusting the slice level at the output may not provide a large enough slice range when compared to the input signal.

The difficulties in implementing slice in a limit amplifier are greater when considering the gain variations that exist due to process and temperature variation. For this design, a single gain stage's gain can vary roughly 2:1 over processing corners and the operating temperature range. For a n-stage topology, the total variation is roughly 2:1 to the nth power. For a six stage topology that is about a 64:1 range. The effect of the large gain uncertainty adds to the inaccuracies relating the slice level to the input signal, and the range of slice level available.

It would be desirable to achieve slice adjustment and offset correction without the offset correction canceling the slice adjustment. It would also be desirable to achieve slice adjustment and offset correction without the need for a large external capacitor to avoid the introduction of noise in sensitive nodes. Thus, it would be desirable for the entire solution to remain on-chip with no external components required. In addition, because of the limitations of available pins typical on clock and data recovery chips, it would be preferable if the entire solution requires as few pins as possible to help minimize pin count and therefore package size.

SUMMARY OF THE INVENTION

Accordingly, the invention provides a slice and offset solution that is entirely on chip by using a digital integrator in the feedback loop of the offset cancellation circuitry. When slicing is required, the amplifier offset is canceled and the specified slice level is introduced into the amplifier, allowing the system designer the flexibility of adjusting the slice level dynamically, or setting it to a fixed level. In the case of a fixed slice level, cancellation of the amplifier offset removes the need to program each system individually—an expensive manufacturing step. When slicing is not needed, the slice circuitry is turned off so as to minimize any power dissipation. In one embodiment only one pin (to program the slicing voltage) is utilized to minimize pin count and therefore package size. The elimination of external passive components saves board area, prevents introduction of undesirable noise at a sensitive node, and saves pins and package size.

In one embodiment the invention provides an integrated circuit that provides a slice and offset solution that includes an amplifier with a plurality of amplifier stages. An offset correction circuit detects an offset from one or more of the amplifier stages and includes a feedback loop that provides a feedback signal to the amplifier to correct the offset. A slice circuit receives an indication of a desired slice voltage and supplies a signal to specify a slice level of the amplifier to the feedback loop of the offset correction circuit so the feedback signal also incorporates the desired slice level.

In a preferred embodiment the feedback loop includes a low pass filter coupled to receive a combined signal indicative of the offset and the slice level. The low pass filter includes a digital integrator circuit supplying a digital value indicative of an integrated value of the combined signal. In one embodiment the digital integrator includes an up/down counter that counts in a direction determined according to a digital signal having a ones-density indicative of a value of the combined signal.

In another embodiment, the invention provides an integrated circuit that includes an amplifier, a slice circuit coupled to adjust a slice level of the amplifier, and an offset correction circuit including low pass filter implemented using a digital integrator coupled to correct an offset of the amplifier.

In still another embodiment, the invention provides a method of operating an amplifier having a plurality of amplifier stages. The method includes sensing an output of one stage of the amplifier to obtain a first offset signal that indicates if an undesired amplifier offset is present in one or more of the amplifier stages. In addition, a second offset signal is generated that indicates a desired amplifier offset. The first and second offset signals are combined to form a combined offset signal. A low pass filter operation is performed on the combined offset signal, which generates a feedback signal that is supplied to an input of a stage of the amplifier to thereby correct the undesired amplifier offset and introduce the desired amplifier offset into the amplifier. The low pass filter operation includes digitally integrating the combined signal.

BRIEF DESCRIPTION OF THE DRAWINGS

The present invention may be better understood, and its numerous objects, features, and advantages made apparent to those skilled in the art by referencing the accompanying drawings.

FIG. 2A shows the output from the TIA amplifier shown in FIG. 1.

FIG. 2B shows the output of a limit amplifier given the input shown in FIG. 2A.

FIG. 2C shows the output of an AGC amplifier given the input shown in FIG. 2A.

The use of the same reference symbols in different drawings indicates similar or identical items.

DESCRIPTION OF THE PREFERRED EMBODIMENT(S)

Figure 1:
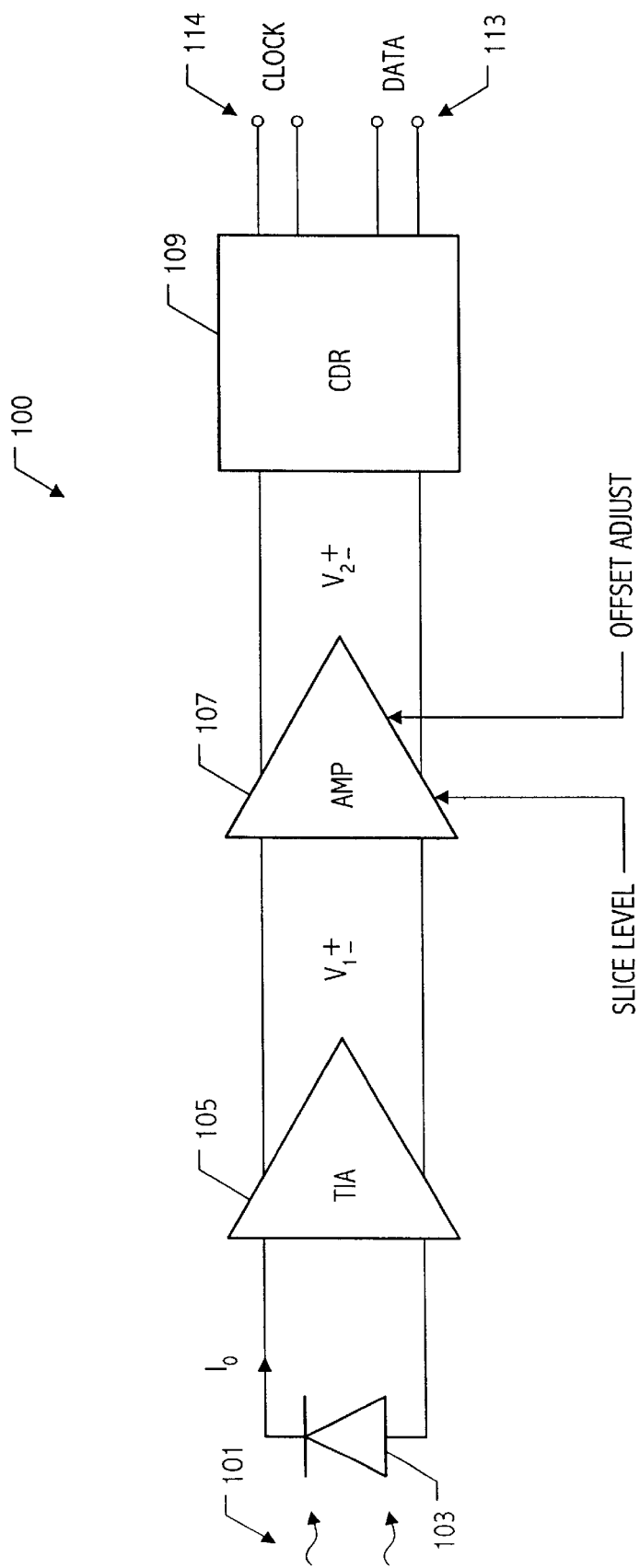
FIG. 1 shows the block diagram of a typical high-speed optical receiver.
Figure 3:
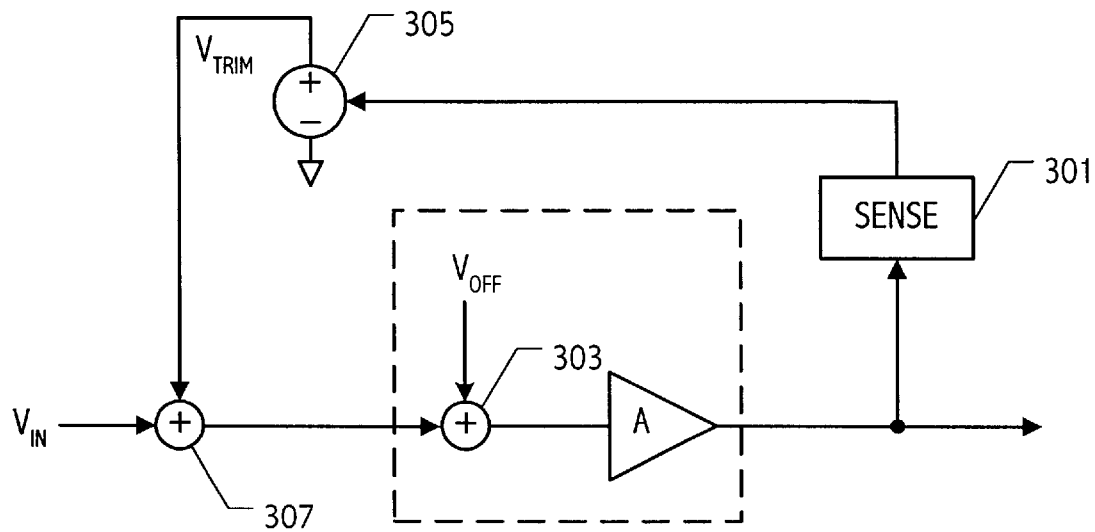
FIG. 3 shows an exemplary feedback system used to correct offset in an amplifier.
Figure 4:
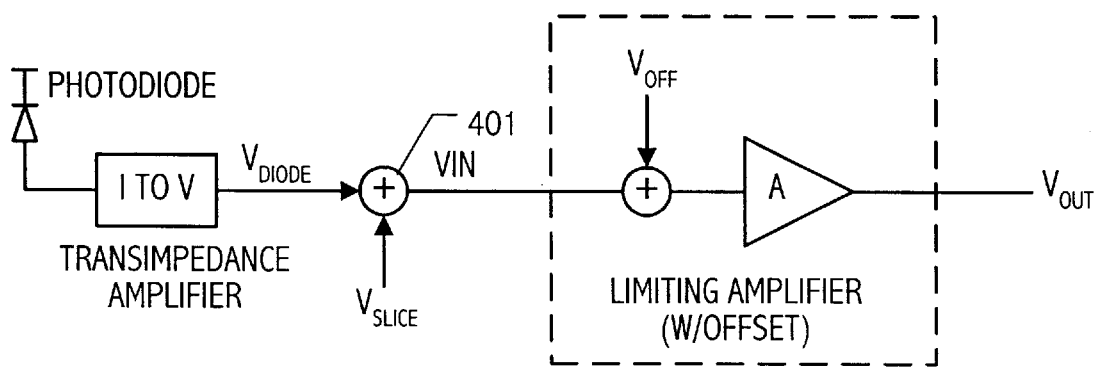
FIG. 4 illustrates the introduction of a slice voltage to account for asymmetrical noise generated by the photodiode.
Figure 5:
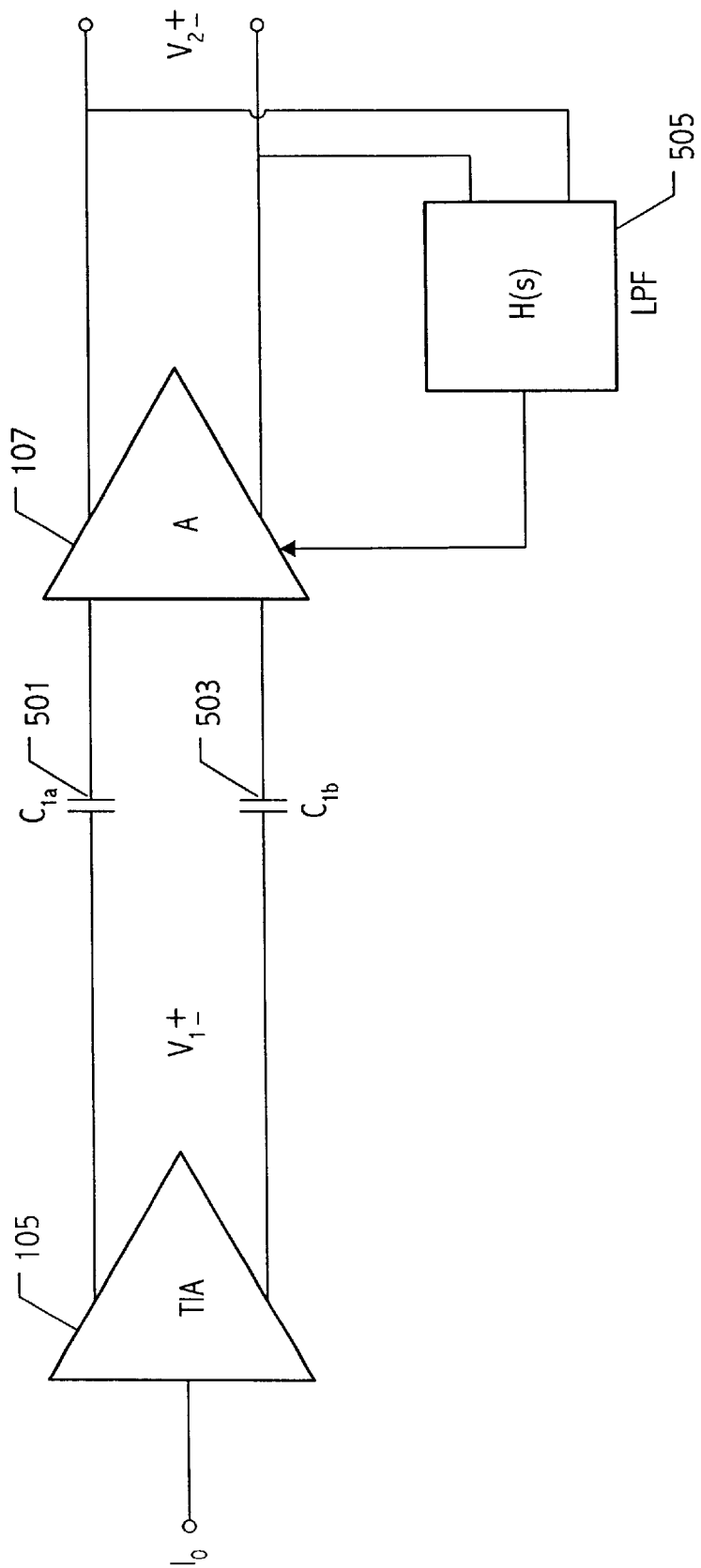
FIG. 5 illustrates an exemplary feedback system used to correct offset in an amplifier.
Figure 6:
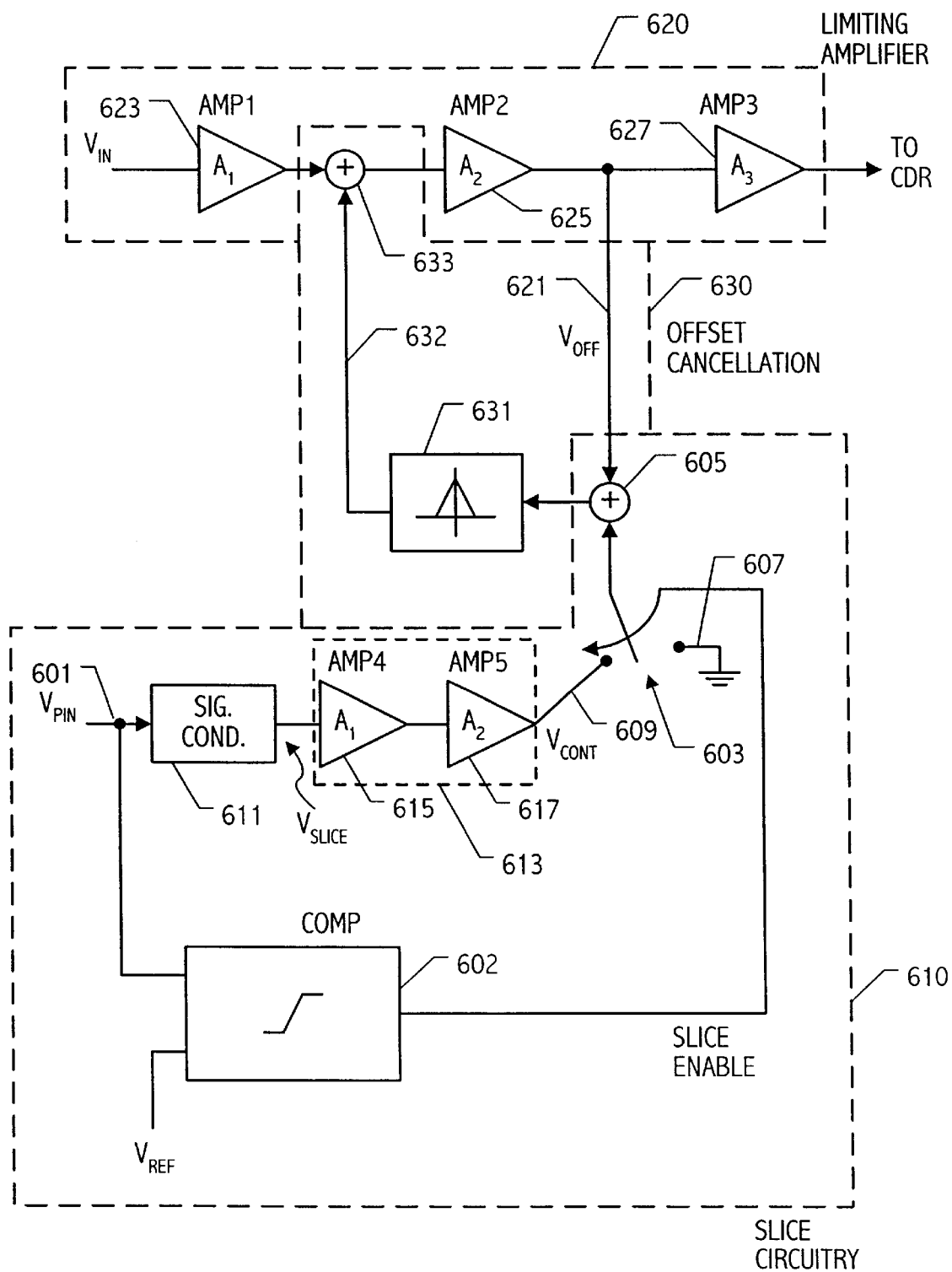
FIG. 6 illustrates a block-level diagram of a slice and offset correction circuit according to one embodiment of the invention.

Referring to FIG. 6, a block-level diagram illustrates a slice and offset correction circuit that achieves slice adjustment and offset correction without the offset correction canceling the slice adjustment. The illustrated embodiment includes a slice circuit 610, an amplifier 620, and an offset correction circuit 630. In a preferred embodiment the amplifier is a multi-stage limit amplifier implemented in CMOS. Because CMOS circuits can recover quickly from an overdrive condition, a limit amplifier is well suited for CMOS. The amplifier 620 includes amplifier stage 623 (AMP1), amplifier stage 625 (AMP2) and amplifier stage 627 (AMP3). Amplifier stage 627 represents one or more stages. In one embodiment, there are six amplifier stages.

The slice level is provided at input pin 601, which in the illustrated embodiment, is the only pin required to implement slicing and offset control. In other embodiments, the slice level may be provided by other communications paths to the slice circuit, e.g. by way of a serial communication port on the integrated circuit. When slicing is required, the amplifier offset present in amplifier stages 623 and 625 is canceled. That allows the flexibility of adjusting the slice level dynamically, or setting it to a fixed level. In the case of a fixed level, cancellation of the amplifier offset removes the need to program each system individually—an expensive manufacturing step. When slicing is not needed, the slice circuitry preferably does not contribute any power dissipation. One desirable aspect of the embodiment illustrated in FIG. 6 is that the solution remains on-chip with no external components required.

In the slice circuitry 610, a comparator 602 senses when $V_{PIN}$ (the pin voltage used to program the slicing voltage) exceeds a reference voltage $V_{REF}$. When it does, that signifies slicing mode and causes the slicing circuitry 610 to power up. When the pin voltage is below $V_{REF}$ the slicing circuitry 610, excluding the comparator 602, is powered down. A switch 603 selects either 0V from ground node 607 or the slicing circuit output control voltage $V_{CONT}$ supplied on node 609 to present to sum block 605 based on the pin voltage.

In slicing mode, the single-ended pin voltage is conditioned in signal conditioning block 611 to provide a suitable differential voltage $V_{SLICE}$ to an offset-corrected, power-reduced replica circuit 613 of the limiting amplifier front end. The limiting amplifier front end is defined in the illustrated embodiment as amplifiers 623 and 625. The slicing replica consists of amplifiers 615 and 617. Note that the gains of amplifiers 623 and 615 are identical, as are the gains of amplifiers 625 and 617. Amplifier 627 represents the remaining gain stages of the limiting amplifier 620 as previously stated. The various gain stages are assumed to be approximately equal in the illustrated embodiment. The control voltage $V_{CONT}$ is combined in summing node 605 with the limiting amplifier front-end output voltage $V_{OFF}$ conveyed on node 630 and is presented to the offset cancellation circuitry 630. The offset cancellation circuitry 630 includes an integrator 631 that, when used in the feedback configuration shown, forces the average value of $V_{OFF}$ to track the voltage $V_{CONT}$. The offset cancellation circuitry 630 supplies a signal on node 632 to summing node 633 that represents the combined offset correction for amplifiers 623 and 625 as well as the slice adjustment based on the slice voltage present on pin 601. When the limiting amplifier front end is in its linear range, the effect of this configuration is to force the average value of $V_{OFF}$ to $A1 \times A2 \times V_{SLICE}$, where A1 and A2 are the gains of amplifiers 623 (AMP1) and 625 (AMP2), respectively. That is indistinguishable from applying an offset of $V_{SLICE}$ to the amplifier input. This configuration also serves to cancel any amplifier offset.

When slicing is disabled, the average value of $V_{OFF}$ is forced to track 0V, therefore canceling any amplifier offset. That allows a designer to select a fixed or variable slice voltage, or turn off slice entirely.

Note that the gains of AMP1, AMP4, and AMP2, AMP5 are chosen to match, given the specific topology of the amplifiers. One requirement for achieving a fixed slicing level (input-referred to the limiting amplifier) is that the slice circuitry tracks the variable gain of the limiting amplifier front end. The slice voltage can be seen as input referred because the replica stage allows the slice voltage to be described relative to the input signal by knowing the gain of the amplifier front end. The gain of the amplifier front end is known because the replica stage matches the gain. Note that the replica stage amplifiers 615 and 617 amplify DC signals unlike amplifiers 623 and 625 which amplify high frequency signals. Thus, the replica stage amplifiers can be made lower power than the amplifier front end stages. For example, the replica stage amplifiers are ⅙ and ¼ of their respective corresponding front end stage amplifiers for an overall power reduction of 5×. Note that the gain of the front end stages is low enough that the output will not saturate for the smaller signals where slice has a beneficial effect.

Figure 7:
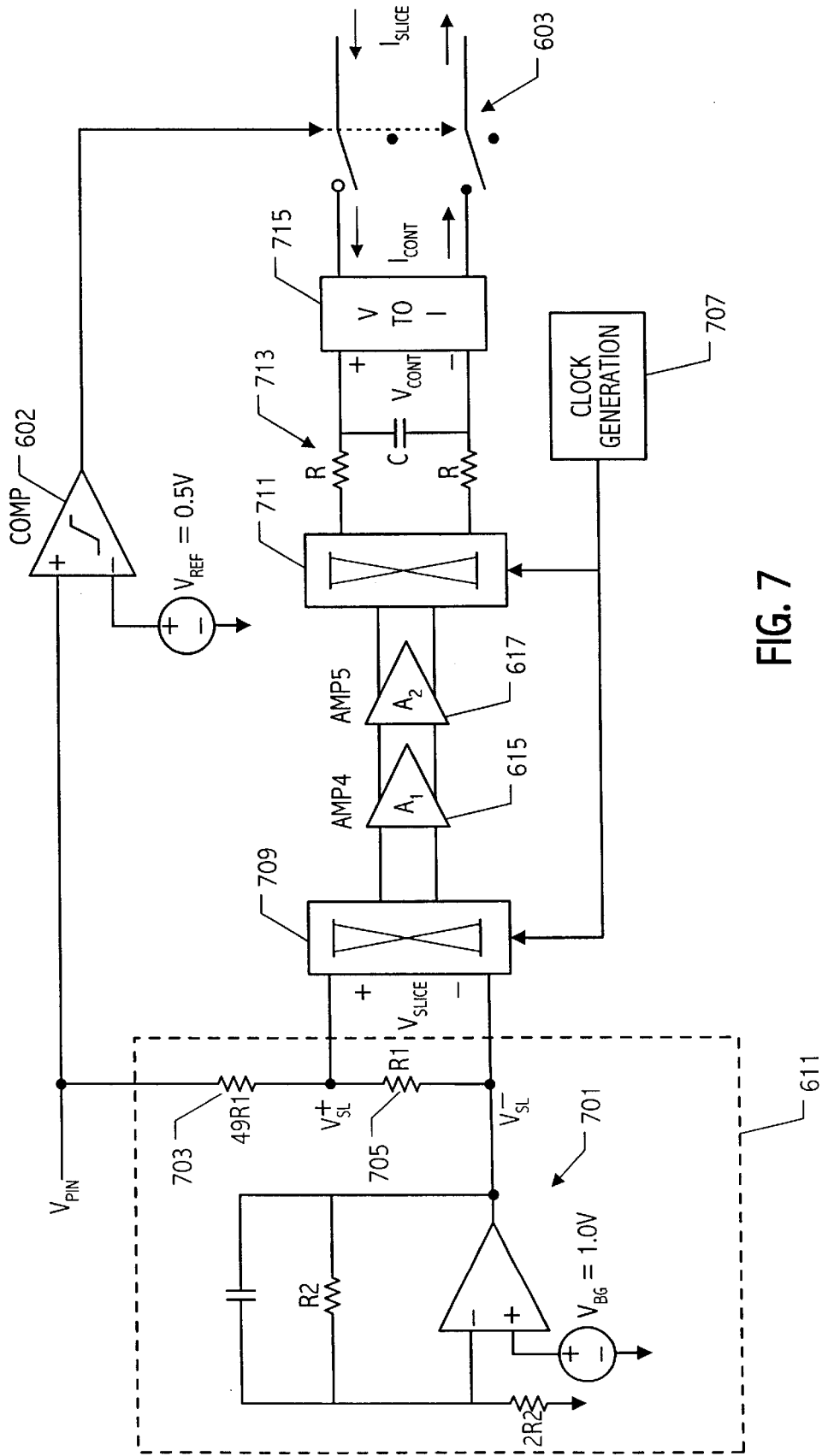
FIG. 7 illustrates additional details of the slice circuit according to one embodiment of the invention.

FIG. 7 illustrates additional details of the slice circuit 610. The signal conditioning circuitry 611 in the illustrated embodiment includes a reference generator 701 and an attenuator formed by resistors 703 and 705. The signal conditioning circuitry 611 creates a differential signal $V_{SLICE}$ where $$V_{SLICE}=V_{SL+}-V_{SL-}=(V_{PIN}-1.5V)/50$$

The signal conditioning circuitry 611 serves to attenuate any noise present at the pin and biases the replica amplifier AMP4 at a relatively fixed common mode voltage. It also allows for slicing levels of either polarity.

The clock generation circuitry 707 along with switch networks 709 and 711 provide chopper stabilization of the replica stage 613. Chopper stabilization is a well-known technique which, when followed by a low-pass filter, cancels any amplifier offset. The integrator 631 serves as the dominant stage in the low-pass filter in the offset cancellation circuitry 630, which heavily filters the chopper artifacts generated by the chopper stabilization. However, an RC filter 713 may also be included, lightly filtering the chopping artifacts to maximize the linear range of the transconductance stage 715. Note that chopper stabilization should not be employed in the limiting amplifier front end because the necessary filtering would adversely affect the bandwidth requirements of the limit amplifier. The transconductance stage 715 converts the differential voltage signal from the RC filter 713 into a differential current, $I_{CONT}$.

As illustrated in FIG. 7, in one embodiment, the comparator 602 closes switch 603 when $V_{PIN}$ is greater than 0.5V, enabling slice mode such that $I_{SLICE}=I_{CONT}$. When $V_{PIN}$ is less than 0.5V, slice mode is disabled and $I_{SLICE}=0A$.

Figure 8:
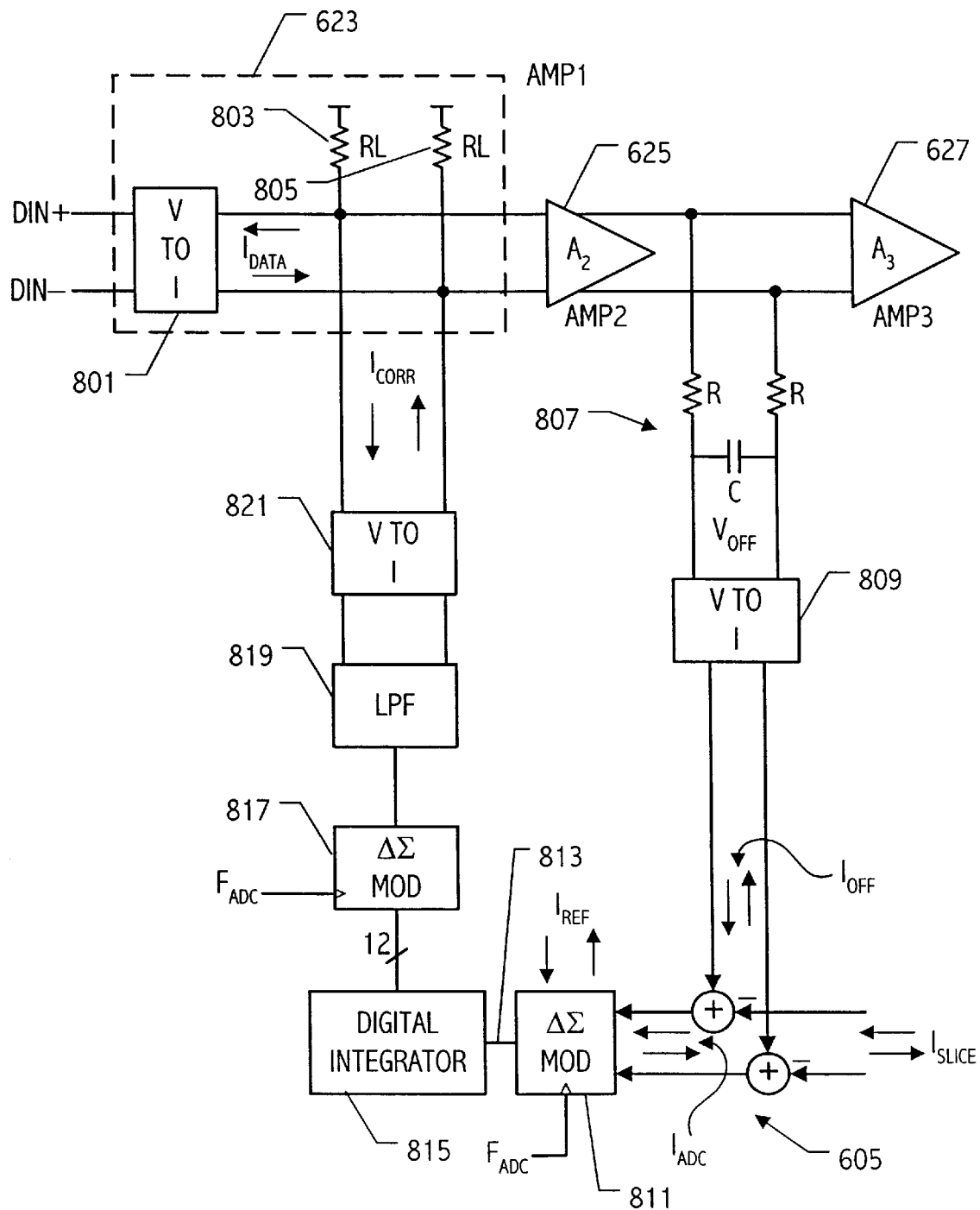
FIG. 8 illustrates additional details of the offset correction circuit according to one embodiment of the invention.

FIG. 8 illustrates additional details of the offset correction circuitry 630. Amplifier 623 (AMP1) includes a transconductance stage 801 feeding a pair of load resistors 803 and 805. A correction current source $I_{CORR}$ is also connected to the load resistors, implementing the summing node 633 shown in FIG. 6.

The output of amplifier 625 (AMP2) is lightly filtered by RC circuit 807, again to maximize the linear range of transconductance stage 809. The output of transconductance stage 809, $I_{OFF}$, is summed with $I_{SLICE}$ in summing node 605 to produce $I_{ADC}$. Note that various signals described herein as voltages may in fact be implemented as currents. Thus, e.g., voltages $V_{CONT}$ and $V_{OFF}$ are shown as entering summing node 605 in FIG. 6, while currents $I_{SLICE}$ and $I_{OFF}$ are shown as entering summing node 605 in FIG. 8. The particular implementation as to the use of voltage or current is system dependent.

A continuous-time current-mode delta sigma modulator 811 produces a digital signal conveyed on node 813, with a ones-density proportional to the ratio of $I_{ADC}/I_{REF}$, where $I_{REF}$ is a fixed reference current.

The modulator output is presented to a digital integrator 815 whose 12-bit output is reconverted to an analog signal by a delta sigma digital to analog converter (DAC). The DAC includes a digital delta sigma modulator 817 and a low-pass filter 819. The signal is then converted to a current by transconductance stage 821 to produce the correction current $I_{CORR}$.

Figure 9:
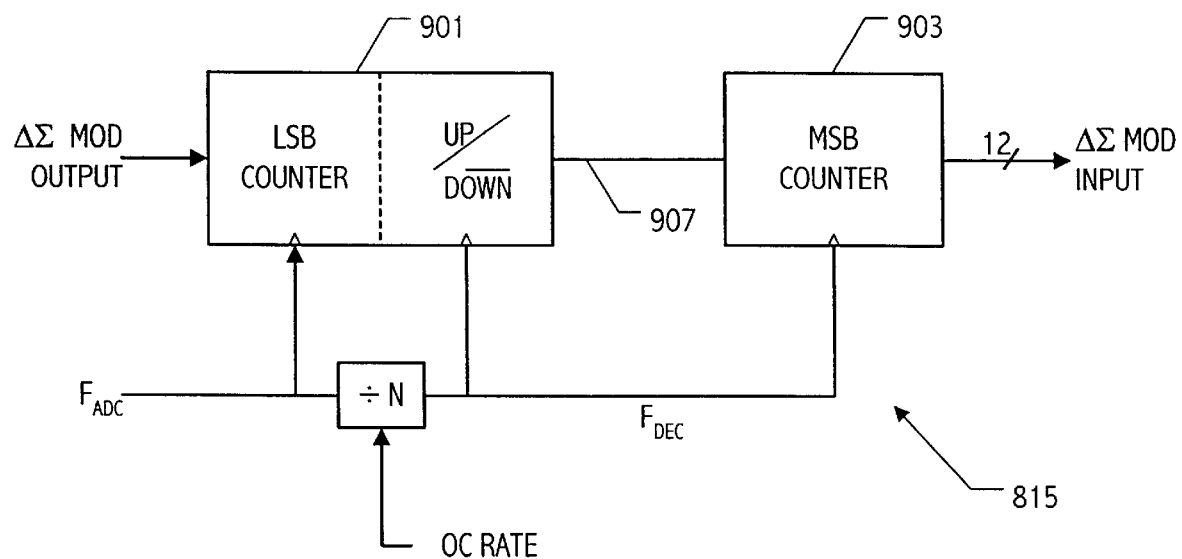
FIG. 9 illustrates additional details of the digital integrator according to one embodiment of the invention.

FIG. 9 illustrates additional details of the digital integrator circuitry 815. Implementation of the integrator in the digital domain allows the correction bandwidth to be set arbitrarily low without requiring any large passive components. That allows the solution to be kept entirely on chip. The integrator 815 includes an up-down counter, which is divided into two counter sections 901 and 903 for power efficiency. The first counter section 901 functions as a least significant bit (LSB) counter, which counts up or down according to the received ones or zeros at the modulator frequency $f_{ADC}$. The LSB counter generates control signals 907 which are supplied at a decimated rate, $f_{DEC}=f_{ADC}/N$. In one embodiment $f_{ADC}$ is approximately 155 MHz.

In one embodiment the OC rate (specifying the data rate in a SONET system) determines N and thus $f_{DEC}$ and the width of the LSB counter. For example, with OC=48, N=16, which implies that the LSB counter is four bits. For OC=24, N=32, which requires a five bit LSB counter. For OC=3, N=256 and the LSB counter is eight bits. The control signals cause the MSB counter 903 to count as follows. If during the N clocks, the LSB counter overflows, the MSB counter counts up. If the LSB counter underflows, the MSB counter counts down. If the LSB counter neither underflows nor overflows, the MSB counter remains the same. Because of this arrangement, the majority of the registers (the MSB counter) are clocked at the decimated rate. That serves to reduce the silicon area and, most importantly, the power dissipation. The variable decimation rate provides a constant data frequency to correction bandwidth ratio. This ensures that the offset correction loop's tracking frequency is as high as possible, given the requirement for attenuating data noise, for each data rate. Note that appropriate handshaking signals may be necessary to accommodate the different clock frequencies used in the LSB and MSB segments.

The bandwidth for the feedback loop has to be sufficient to track changes that occur due to, e.g., temperature and time. In an exemplary embodiment, the bandwidth suitable for an OC-48 SONET system is approximately 300–600 Hz for operation with slice enabled and approximately 600–1300 with just offset correction enabled.

The embodiment shown in FIG. 6 and shown in additional details in FIGS. 7–9 has several advantages. One advantage is that the large low pass filter utilized for the offset correction circuitry, which is made possible by the digital integrator, also functions to filter the output of the replica stage. Another advantage is that the feedback path is fed back to an amplifier other than the first stage. That is advantageous because a large impedance at the input node of the limit amplifier can cause a low frequency pole resulting in instability in the low frequency feedback loop implementing the offset correction. Note that offset correction is only provided for the first two stages of the CMOS limit amplifier shown in FIG. 6. However, the gain from those stages is sufficiently large to swamp any offset present in the remaining stages.

Figure 10:
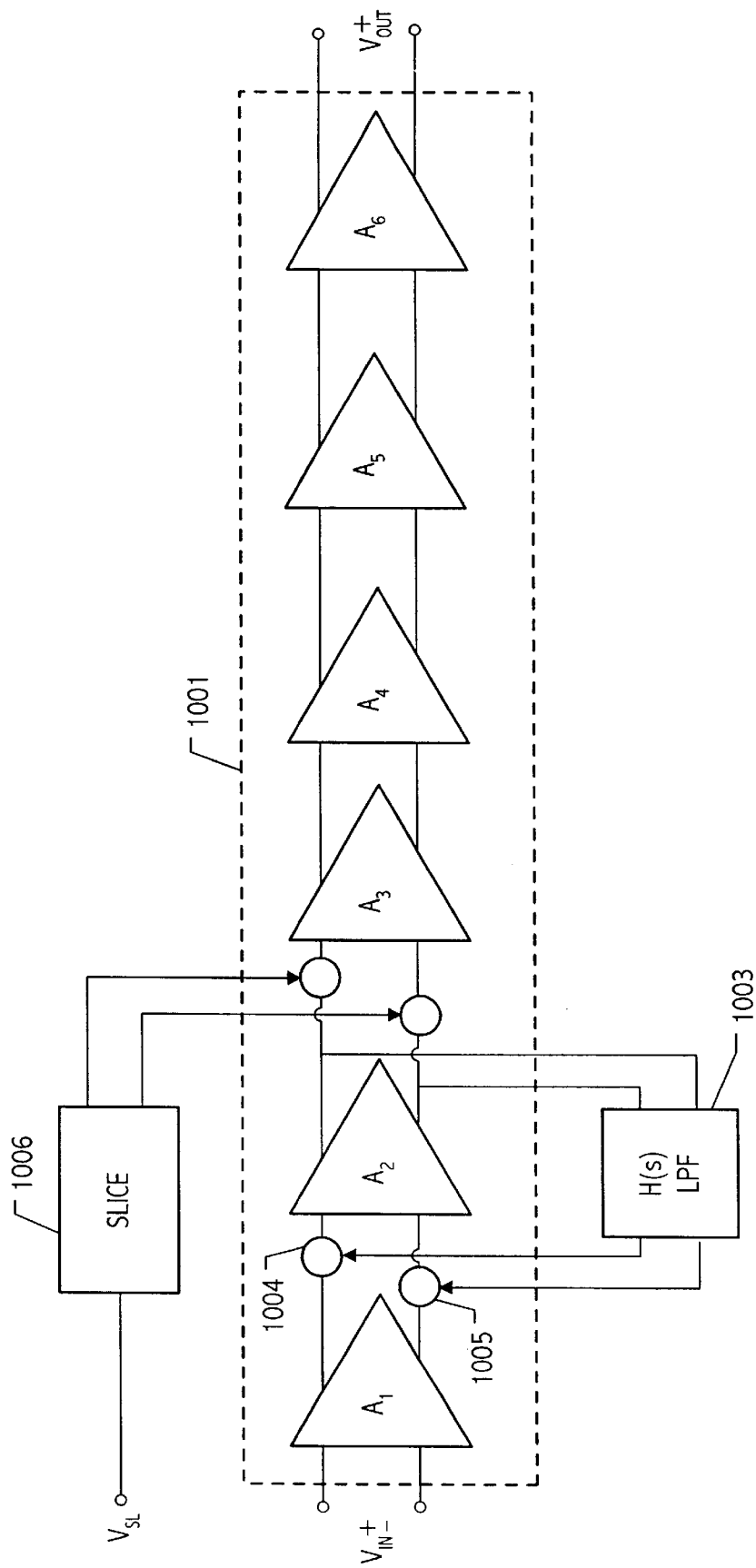
FIG. 10 illustrates a high block-level diagram of a slice and offset correction circuit according to another embodiment of the invention.

FIG. 10 shows a block diagram of an alternative embodiment that provides both offset correction and an input referred slice voltage in a CMOS limit amplifier. Note that although a differential structure is shown, single ended structures could also be used in the various blocks shown in FIG. 10 and the other illustrated embodiments. The limit amplifier 1001 includes six gain stages $A_1$–$A_6$ to provide adequate gain for the minimum input signal. The offset is sensed from the output of the second stage $A_2$ using a low pass filter 1003, which provides the signals for the negative feedback back supplied to the summing blocks 1004 and 1005, which sum the feedback signal from low pass filter 1003 and the output of the first stage $A_1$. The third stage $A_3$ receives inputs that are a sum of the output of the second stage and the slice signal supplied from slice circuit 1006. Note that significant filtering may be needed on the slice signal if it is noisy since the low pass filter of the offset correction circuit does not also filter the slice voltage in this embodiment. Thus, a digital filter such as that shown in relation to FIG. 8 may be incorporated into slice circuit 1006 to provide an appropriate level of filtering. In addition, the slice circuitry 1006 may include a replica stage described herein to match the gain of amplifier stages $A_1$–$A_2$.

The slice voltage can be seen as affecting the output of a gain stage (amplifier A1 and A2) that does not contain offset, and whose gain is low enough that the output will not saturate for the smaller signals where slice has a beneficial effect. For such smaller signals the slice voltage can easily be described relative to the input signal by knowing the gain of this first section. Another advantage of this arrangement is that the gain variation to the point where the slice signal is applied varies over process and temperature by only up to a 4:1 range, which is much more manageable. The offset for the last four stages is not corrected in this arrangement; however, if adequate gain is provided in the first section, the input referred effect of these stages can be made negligible. Note that unlike the embodiment shown in FIG. 6, the slicing level control signal has not been introduced into the offset loop. For a low frequency signal however, introducing the signal into the offset loop as shown in FIG. 6, is equivalent to introducing the signal at the input of amplifier A3 as shown in FIG. 10.

Figure 11:
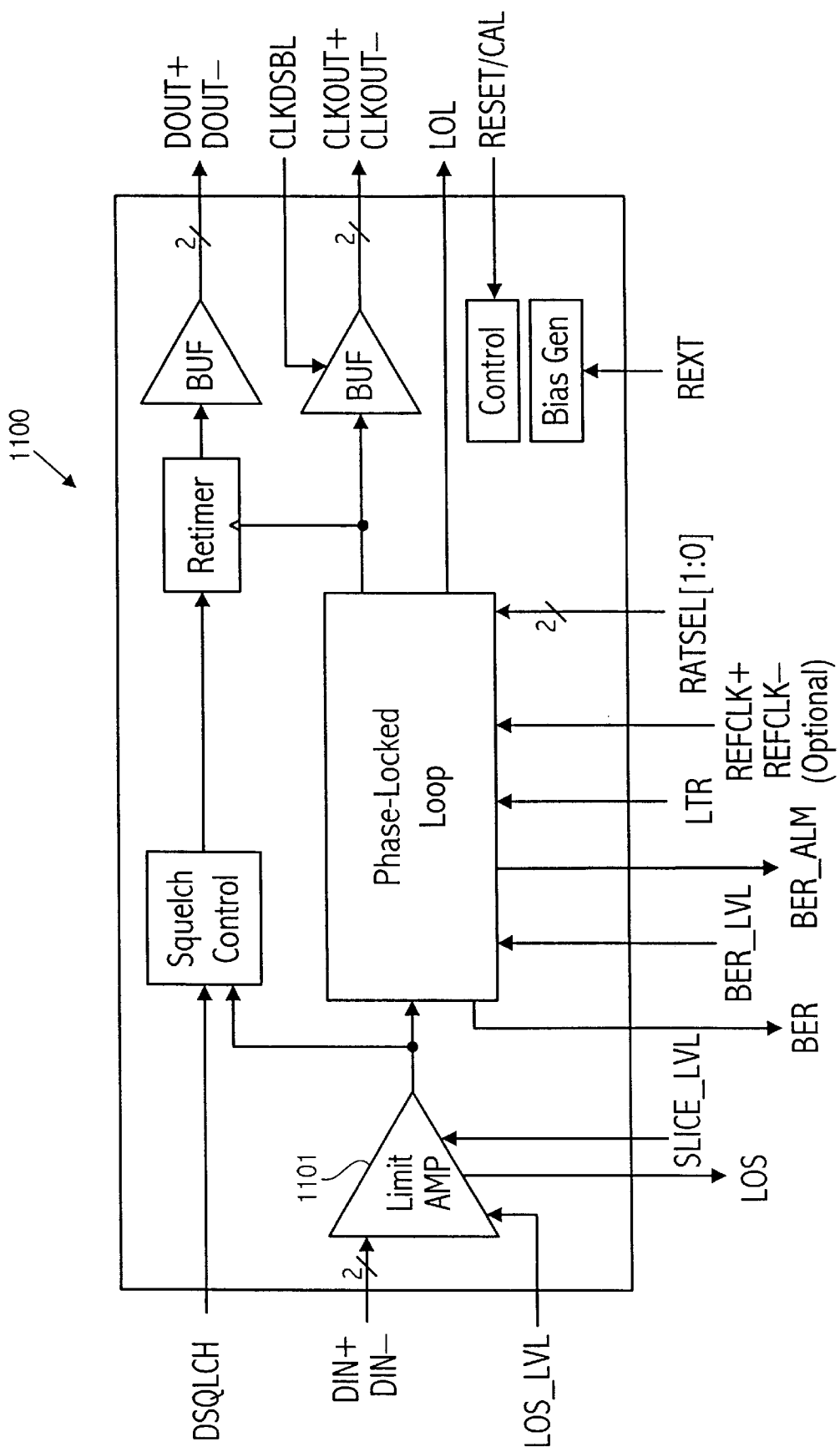
FIG. 11 illustrates a high block-level diagram of a clock and data recovery integrated circuit in which the invention described herein can be advantageously used.

FIG. 11 shows an exemplary clock and data recovery integrated circuit 1100 into which the slice and offset correction techniques described herein may incorporated. As can be seen in FIG. 11, the limit amplifier block 1101 receives the differential input signal (DIN) and slice indication (SLICE_LVL) and supplies on its output a data signal used for clock and data recovery. Limit amplifier block 1101 incorporates the slice and offset control described herein.

Thus, various embodiments have been described for adjusting a slice level while correcting offset. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. An integrated circuit comprising:
    an amplifier having a plurality of amplifier stages;
    an offset correction circuit coupled to detect an offset from one or more of the amplifier stages, the offset correction circuit including a feedback loop coupled to provide a feedback signal to the amplifier to correct the offset; and
    a slice circuit coupled to receive an indication of a desired slice voltage and to supply a signal to specify a slice level of the amplifier, the slice circuit coupled to supply a signal indicative of the slice level to the feedback loop.

2. The integrated circuit as recited in 1, wherein the feedback loop includes a low pass filter coupled to receive a combined signal indicative of the offset and the slice level.

3. The integrated circuit as recited in 2, wherein the low pass filter includes a digital integrator circuit supplying a digital value indicative of an integrated value of the combined signal.

4. The integrated circuit as recited in 3 wherein the digital integrator includes an up/down counter coupled to count in a direction determined according to a digital signal having a ones-density indicative of a value of the combined signal.

5. The integrated circuit as recited in 4 wherein the ones-density is proportional to the ratio of the combined signal and a reference signal.

6. The integrated circuit as recited in 4 wherein the up/down counter includes a first counter portion operable at a first clock speed and a second counter portion operable at a second clock speed, the first counter portion being coupled to count according to a digital signal having a ones density proportional to the ratio of the combined signal and a reference signal, the first clock speed being faster than the second clock speed.

7. The integrated circuit as recited in claim 6 wherein the first counter portion includes the least significant bits of the up/down counter, the first counter portion supplying one or more signals to the second counter portion to cause the second counter portion to count according to the value of the first counter portion.

8. The integrated circuit as recited in claim 6 wherein the first counter portion has a programmable width determined by the difference in clock speeds between the first and second portion.

9. The integrated circuit as recited in claim 7 wherein the first counter portion provides an indication of underflow and overflow to indicate a direction of count for the second counter portion.

10. The integrated circuit as recited in 3, wherein the feedback loop includes:
    a first delta sigma modulator circuit coupled to supply to an input of the digital integrator circuit a digital signal having a ones density proportional to the ratio of the combined signal and a reference signal.

11. The integrated circuit as recited in 3 further comprising a digital to analog converter coupled to convert an output of the digital integrator to an analog signal, the analog signal being coupled to an input of an amplifier stage to provide the feedback signal incorporating both slice and offset correction.

12. The integrated circuit as recited in claim 11 further comprising a transconductance amplifier coupled to the digital to analog converter connected to supply the feedback signal as a current to the input of the amplifier stage.

13. The integrated circuit as recited in 1, wherein the feed back signal is coupled to an input of an amplifier stage other than a first stage of an amplifier.

14. The integrated circuit as recited in 1 wherein the amplifier is a limit amplifier.

15. The integrated circuit as recited in 1, wherein the slice circuit tracks gain associated with a front end of the amplifier, the front end of the amplifier including those amplifier stages for which the offset correction circuit provides offset correction.

16. The integrated circuit as recited in claim 15 wherein the slice circuit further comprises a replica amplifier stage matching the gain associated with the front end of the amplifier.

17. The integrated circuit as recited in claim 16 wherein the slice circuit further comprises a chopper stabilization circuit providing chopper stabilization for the replica amplifier stage.

18. The integrated circuit as recited in claim 1 further comprising a compare circuit, coupled to compare the indication of the slice level to a reference and to supply an enable signal enabling slice operation according to the comparison.

19. The integrated circuit as recited in claim 18 further comprising a switch circuit coupled to supply one of a signal indicative of a desired slice voltage and a ground signal according to the comparison.

20. The integrated circuit as recited in claim 19 wherein the switch circuit operates to supply a ground as the signal indicative of the slice level to the feedback loop when slice operation is not enabled.

21. The integrated circuit as recited in claim 1 wherein the slice level is input-referred to the amplifier.

22. An integrated circuit comprising:
    an amplifier;
    a slice circuit coupled to adjust a slice level of the amplifier; and
    an offset correction circuit including a first digital integrator circuit coupled to correct an offset of the amplifier.

23. The integrated circuit as recited in 22, wherein the slice circuit tracks gain of a front end of the amplifier, the front end of the amplifier including amplifier stages for which the offset correction circuit provides offset correction.

24. The integrated circuit as recited in claim 23 wherein the slice circuit further comprises a replica amplifier stage matching a gain associated with the front end of the amplifier, thereby tracking the gain of the front end of the amplifier.

25. The integrated circuit as recited in claim 24 wherein the slice circuit further comprising a chopper stabilization circuit providing chopper stabilization for the replica amplifier stage.

26. The integrated circuit as recited in claim 22 wherein the slice circuit is independent of a feedback loop of the offset correction circuit.

27. The integrated circuit as recited in claim 26 wherein the slice circuit incorporates a second digital integrator circuit.

28. An integrated circuit comprising:
    an amplifier;
    means for correcting offset present in one or more stages of the amplifier; and
    means for adjusting a slice level of the amplifier by supplying to the means for correcting offset a slice signal indicative of a desired slice level.

29. The integrated circuit as recited in claim 28 further comprising means for providing an offset correction signal correcting an undesired offset and causing a user programmable offset to be introduced into the amplifier.

30. A method of operating an amplifier having a plurality of amplifier stages, comprising:
    sensing an output of one stage of the amplifier to obtain a first offset signal indicative of an undesired amplifier offset present in one or more of the amplifier stages;
    generating a second offset signal indicative of a desired amplifier offset;
    combining the first offset signal and the second offset signal to form a combined offset signal;
    performing a low pass filter operation on the combined offset signal; and
    generating according to an output of the low pass filter operation, a feedback signal; and
    supplying the feedback signal to an input of a stage of the amplifier to thereby correct the undesired amplifier offset and introduce the desired amplifier offset into the amplifier.

31. The method as recited in claim 30 wherein performing the low pass filter operation includes digitally integrating the combined offset signal in a digital integrator.

32. The method as recited in claim 31 wherein performing the low pass filter operation includes supplying a digital stream indicative of a ratio of the combined offset signal to a reference signal to the digital integrator.

33. The method as recited in 32 wherein digitally integrating further comprising counting an up/down counter in a direction determined according to the digital stream.

34. The method as recited in 32 wherein the digital stream has a ones-density that is proportional to the ratio of the combined signal offset signal and the reference signal.

35. The method as recited in 32 wherein digitally integrating further comprises:
    counting the digital stream in a counter having a first and second counter portion, the first counter portion operable at a first clock speed, the first counter portion counting up or down according to the digital stream; and
    supplying one or more signals from the first counter portion to cause a second counter portion to count according to the value of the first counter portion, the second counter portion being operable at a second clock speed, the first clock speed being faster than the second clock speed.

36. The method as recited in 35 wherein the one or more signals from the first counter portion indicate counter underflow and overflow in the first counter portion.

37. The method as recited in claim 35 wherein the first counter portion includes the least significant bits of the counter.

38. The method as recited in claim 31 wherein generating the feedback signal further comprising converting an output of the digital integrator into an analog signal.

39. The method as recited in claim 38 wherein generating the feedback signal further comprises supplying the analog signal to a transconductance circuit and using the output of the transconductance circuit as the feedback signal.

40. The method as recited in claim 30, wherein the feedback signal is coupled to an input of an amplifier stage other than a first stage of an amplifier.

41. The method as recited in claim 30 wherein the amplifier is a limit amplifier.

42. The method as recited in claim 30 wherein generating the desired amplifier offset further comprises supplying a desired offset signal indicative of the desired amplifier offset to a replica amplifier circuit, the replica amplifier circuit tracking a gain associated with the one or more amplifier stages in which the undesired amplifier offset is present.

43. The method as recited in claim 42 further comprising stabilizing the signal generated in the replica amplifier circuit using a chopper stabilization circuit.

44. The method as recited in claim 42 further comprising stabilizing the signal generated in the replica amplifier circuit using a chopper stabilization circuit.

45. The method as recited in claim 30 wherein the desired amplifier offset is a slice level input-referred to the amplifier in a linear range of the one or more amplifier stages.

46. The method as recited in claim 30 further comprising:
    comparing an indication of the desired amplifier offset to a reference; and
    selectively supplying one of an electrical ground and an output of a replica amplifier stage as the second offset signal according to the comparison.

47. The method as recited in claim 30 further comprising:
    receiving optical energy in a diode;
    supplying a signal from the diode indicative of the received optical energy to a transimpedance amplifier; and
    supplying the output of the transimpedance amplifier to the amplifier.

48. The method as recited in claim 30 wherein the stage receiving the feedback signal at its input is not a first stage of the amplifier.

49. The method as recited in claim 30 wherein the amplifier is a limit amplifier.

* * * * *

UNITED STATES PATENT AND TRADEMARK OFFICE
CERTIFICATE OF CORRECTION

PATENT NO.    : 6,657,488 B1  
DATED         : December 2, 2003  
INVENTOR(S)   : Eric T. King et al.

Page 1 of 1

It is certified that error appears in the above-identified patent and that said Letters Patent is hereby corrected as shown below:

<u>Title page</u>  
Item [75], Inventors, "Eric T. King, Temple, NH (US); Michael H. Perrott, Cambridge, MA (US); Douglas F. Pastorello, Hudson, NH (US)" should read -- Eric T. King, Temple, NH (US), Michael H. Perrott, Cambridge, MA (US); Douglas F. Pastorello, Hudson, NH (US); Dan Bernard Kasha, Providence, RI (US) --

Signed and Sealed this

Twenty-eighth Day of June, 2005

JON W. DUDAS  
*Director of the United States Patent and Trademark Office*